United States Patent
Jung et al.

(10) Patent No.: US 8,173,506 B2
(45) Date of Patent: May 8, 2012

(54) METHOD OF FORMING BURIED GATE ELECTRODE UTILIZING FORMATION OF CONFORMAL GATE OXIDE AND GATE ELECTRODE LAYERS

(75) Inventors: Eun-ji Jung, Suwon-si (KR); Hyun-soo Kim, Gwacheon-si (KR); Byung-hee Kim, Seoul (KR); Dae-yong Kim, Yongin-si (KR); Woong-hee Sohn, Seoul (KR); Kwang-jin Moon, Suwon-si (KR); Jang-hee Lee, Yongin-si (KR); Min-sang Song, Seongnam-si (KR); Eun-ok Lee, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 346 days.

(21) Appl. No.: 12/626,959

(22) Filed: Nov. 30, 2009

(65) Prior Publication Data
US 2010/0240184 A1    Sep. 23, 2010

(30) Foreign Application Priority Data
Mar. 23, 2009    (KR) .................. 10-2009-0024573

(51) Int. Cl.
*H01L 21/336*    (2006.01)
(52) U.S. Cl. .. 438/259; 438/270; 438/576; 257/E29.201
(58) Field of Classification Search .................. 438/259, 438/270, 576; 257/E29.201
See application file for complete search history.

(56) References Cited

U.S. PATENT DOCUMENTS

| 7,323,745 | B2 | 1/2008 | Kinzer |
| 7,772,668 | B2* | 8/2010 | Pan ................................ 257/492 |
| 7,952,137 | B2* | 5/2011 | Lin et al. ........................ 257/328 |
| 2003/0181011 | A1* | 9/2003 | Curro et al. .................... 438/270 |
| 2005/0272233 | A1* | 12/2005 | Lee et al. ....................... 438/585 |
| 2008/0157212 | A1* | 7/2008 | Lavoie et al. .................. 257/369 |

FOREIGN PATENT DOCUMENTS

| JP | 2007-180310 | 7/2007 |
| KR | 1020060104213 A | 10/2006 |

* cited by examiner

*Primary Examiner* — Thanh V Pham
(74) *Attorney, Agent, or Firm* — Volentine & Whitt, PLLC

(57) ABSTRACT

A method of forming a buried gate electrode prevents voids from being formed in a silicide layer of the gate electrode. The method begins by forming a trench in a semiconductor substrate, forming a conformal gate oxide layer on the semiconductor in which the trench has been formed, forming a first gate electrode layer on the gate oxide layer, forming a silicon layer on the first gate electrode layer to fill the trench. Then, a portion of the first gate electrode layer is removed to form a recess which exposed a portion of a lateral surface of the silicon layer. A metal layer is then formed on the semiconductor substrate including on the silicon layer. Next, the semiconductor substrate is annealed while the lateral surface of the silicon layer is exposed to form a metal silicide layer on the silicon layer.

17 Claims, 9 Drawing Sheets

METHOD OF FORMING BURIED GATE ELECTRODE UTILIZING FORMATION OF CONFORMAL GATE OXIDE AND GATE ELECTRODE LAYERS

CROSS-REFERENCE TO RELATED APPLICATIONS

This application claims the benefit of Korean Patent Application No. 10-2009-0024573, filed on Mar. 23, 2009, in the Korean Intellectual Property Office.

BACKGROUND

The present inventive concept relates to a method of fabricating a semiconductor device. More particularly, the inventive concept relates to a method of fabricating a semiconductor device having a buried gate electrode.

In recent years, research is being conducted on a buried cell array transistor (BCAT) in which a word line (or gate electrode) is buried in a semiconductor substrate.

A BCAT structure allows for word lines to have a pitch (or spacing) of about 0.5 F and helps to minimize the cell area. Also, a buried gate of a BCAT structure may provide a greater effective channel length than a stacked gate or recessed gate. Furthermore, the buried gate of the BCAT structure is advantageous in that it does not yield protrusions. For example, other structures may be easily formed on the semiconductor substrate. In particular, a planarizing process does not have to be carried out after the BCAT structure has been formed. In addition, the forming of the buried gate of the BCAT structure does not require the patterning of a gate electrode. Thus, a SCAT structure facilitates the forming of a metal gate.

One approach that has been considered for burying a word line in a BCAT is to use a chemical vapor deposition (CVD) to form a TiN metal gate in a trench in a substrate. However, this technique has the following problems.

The trench must be rather deep to enable a sub-30 nm 4F2 process because the resistivity of TiN is higher than that desired. Also, the Cl component of the $TiCl_4$ source gas typically used in the CVD process of forming the TiN may penetrate a gate oxide layer and thereby give rise to poor leakage current characteristics of the resulting gate. Furthermore, a TiN buried gate of a cell region may be nonuniformly recessed during the forming of a gate electrode on a peripheral circuit region of a substrate.

Another approach proposes the forming of an additional silicide layer on a TiN metal gate. The desired resistance may be obtained even if the trench in which the TiN is formed is shallow because the silicide layer has a very low resistivity. However, a silicide layer may often have a non-uniform thickness when formed on a narrow layer, i.e., as applied to a gate with a small line width. In this case, deviations in the resistance of word lines are created. Moreover, voids may be formed in a silicide layer when the silicide layer is formed in a narrow trench.

SUMMARY

According to an aspect of the inventive concept, there is provided a method of forming a buried gate electrode which includes forming a trench in a semiconductor substrate, forming a conformal gate oxide layer on the semiconductor substrate including within the trench, forming a first gate electrode layer on the gate oxide layer in the trench, forming a silicon layer on the first gate electrode layer in the trench, removing a portion of the first gate electrode layer to form a recess that exposes a portion of a lateral surface of the silicon layer, forming a metal layer on the silicon layer in the trench, and subsequently annealing the semiconductor substrate while the portion of the lateral surface of the silicon layer remains exposed to form a metal silicide layer on the silicon layer.

According to another aspect of the inventive concept, there is provided a method of forming gate electrodes, which includes forming a first gate oxide layer on a semiconductor substrate including across a cell region and a peripheral circuit region, forming a stacked pattern on the first gate oxide layer, etching the resultant structure using the stacked pattern as an etch mask to form a trench in the cell region, forming a second gate oxide layer conforming to the topography of the semiconductor substrate including the trench, forming a first buried gate electrode layer on the second gate oxide layer in the trench, forming a silicon layer on the first buried gate electrode layer in the trench, removing a portion of the first buried gate electrode layer from an upper portion of the trench to expose a portion of a lateral surface of the silicon layer, forming a metal layer on the first gate electrode layer, subsequently annealing the semiconductor substrate while the portion of the lateral surface of the silicon layer remains exposed to form a metal silicide layer on the silicon layer, and removing a metal layer that does not react with the silicon layer in the forming of the metal silicide layer.

The stack pattern includes a first conductive layer and a first mask layer and has an opening formed in the cell region. The method may further include forming a second mask layer on the metal silicide layer in the trench, and forming a gate electrode in the peripheral circuit region by patterning the first conductive layer. Also, a second conductive layer may be formed on the first conductive layer after the second mask layer has been formed. In this case, a stacked gate electrode is formed in the peripheral circuit region by patterning the first and second conductive layers.

BRIEF DESCRIPTION OF THE DRAWINGS

Embodiments of the inventive concept will be more clearly understood from the following detailed description thereof taken in conjunction with the accompanying drawings in which.

DETAILED DESCRIPTION OF THE PREFERRED EMBODIMENTS

Figure 1A:
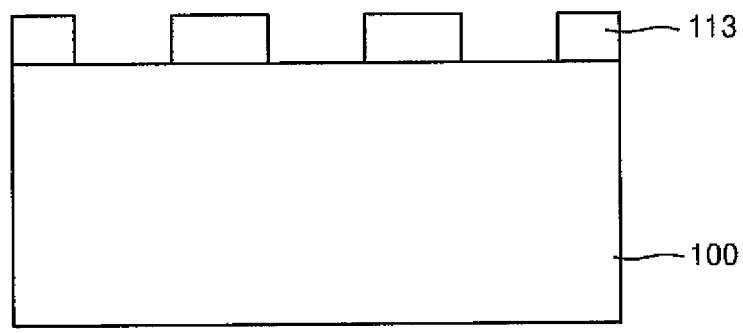
FIGS. 1A through 1I are cross-sectional views of a substrate and together illustrate an embodiment, according to the present inventive concept, of a method of forming a buried gate electrode of a buried cell array transistor (BCAT)

The present inventive concept will now be described more fully with reference to the accompanying drawings, in which embodiments of the inventive concept are shown. In the drawings, the thicknesses of layers and regions may be exaggerated for clarity. Also, like reference numerals are used to designate like elements throughout each set of drawings used to depict a particular embodiment of the inventive concept.

FIGS. 1A through 1I illustrate an example of a method of forming a buried gate electrode of a buried cell array transistor (BCAT) according to the inventive concept. In the example, the buried gate electrode forms a buried word line.

Referring to FIG. 1A, a mask pattern 113 is formed on a semiconductor substrate 100. The mask pattern 113 is formed of material having an etch selectivity with respect to the semiconductor substrate 100. For example, the mask pattern 113 may be formed of a silicon oxide layer or a silicon nitride layer. Alternatively, the mask pattern 113 may comprise at least two layers, stacked one upon the other, selected from the group consisting of a silicon layer, a silicon oxide layer, and a silicon nitride layer.

The mask pattern 113 may be formed by depositing material on the substrate 100 and patterning the material using photolithography and etching processes. When the mask pattern 113 is of a silicon nitride layer, a pad oxide layer (not shown) may be formed on the semiconductor substrate 100 before the material from which the mask pattern 113 is formed is deposited on the substrate 100.

Also, and although not shown in the drawings, source and drain regions may be formed in the semiconductor substrate 100 before the mask pattern 113 is formed by implanting impurities into regions of the substrate. Alternatively, such source and drain regions may be formed after the buried gate (described later on) is formed.

Figure 1B:
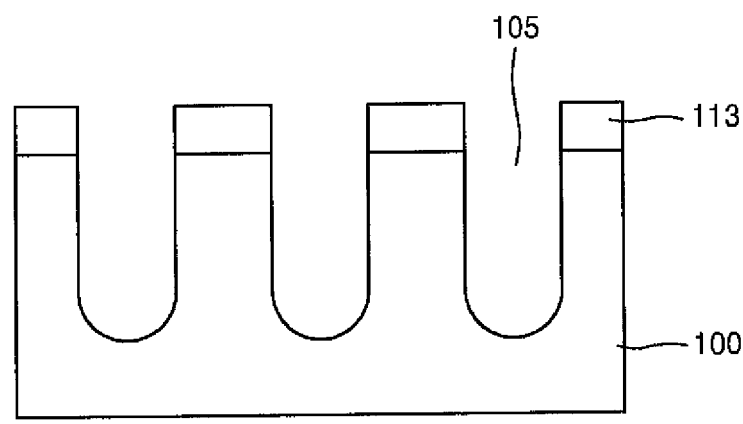

Referring to FIG. 1B, the semiconductor substrate 100 is etched using the mask pattern 113 as an etch mask, thereby forming a trench 105 in the semiconductor substrate 100. The process used to etch the semiconductor substrate 100 may be a dry etching process.

Figure 1C:
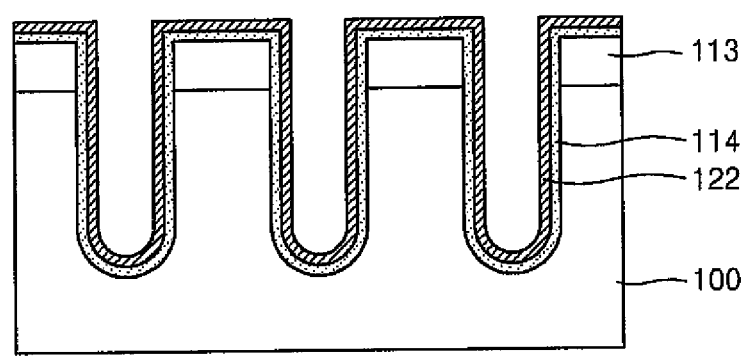

Referring to FIG. 1C, a conformal gate oxide layer 114 is formed on the semiconductor substrate 100. Thus, the gate oxide layer 114 extends along the bottom and sides of the trench 105. The gate oxide layer 114 may be a silicon oxide layer or a high-k dielectric layer. In the case in which the gate oxide layer 114 is a silicon oxide layer, the gate oxide layer 114 may be formed by a thermal oxidation process, a chemical vapor deposition (CVD) process, or an atomic layer deposition (ALD) process. In the case in which the gate oxide layer 114 is a high-k dielectric layer, the gate oxide layer 114 may be formed of $HfO_2$, $HfSiO_4$, $HfAlO$, $ZrO_2$, $ZrSiO_4$, $TaO_2$, $Al_2O_3$, barium-strontium-titanate (BST) or lead-zirconate-titanate (PZT), using a CVD process or an ALD process.

Subsequently, a first gate electrode layer 122 is formed on the gate oxide layer 114. The first gate electrode layer 122 may comprise a silicon germanium (SiGe) layer 122. More specifically, the first gate electrode layer 122 may be a poly-crystalline SiGe (poly-SiGe) layer doped with impurities to provide a desired work function and to increase the conductivity otherwise provided by the SiGe. In this case, the first gate electrode layer 122 may be formed by a CVD process or an ALD process.

In this embodiment, the first gate electrode layer 122 is in direct contact with the gate oxide layer 114 and contributes to establishing the threshold voltage of the gate. For example, the first gate electrode layer 122 is fabricated to have a work function that will establish the proper threshold voltage required for a metal-oxide semiconductor field effect transistor (MOSFET).

Depletion, which occurs in a poly-Si layer near the interface between the poly-Si layer and a gate oxide layer, is suppressed in a SiGe layer near the interface between a SiGe layer and the gate oxide layer. Also, this arrangement may be characterized as having a relatively small equivalent oxide thickness (EOT). Furthermore, a high-k dielectric layer formed of SiGe is more thermodynamically stable than a poly-Si layer. Also, the SiGe layer has a lower resistance than a poly-Si layer. Therefore, the SiGe layer helps to minimize the resistance of the gate electrode. Finally, forming the SiGe layer does not produce by-products (e.g., Cl) that degrade the gate oxide layer. Therefore, a highly reliable of a transistor may be produced.

Figure 1D:
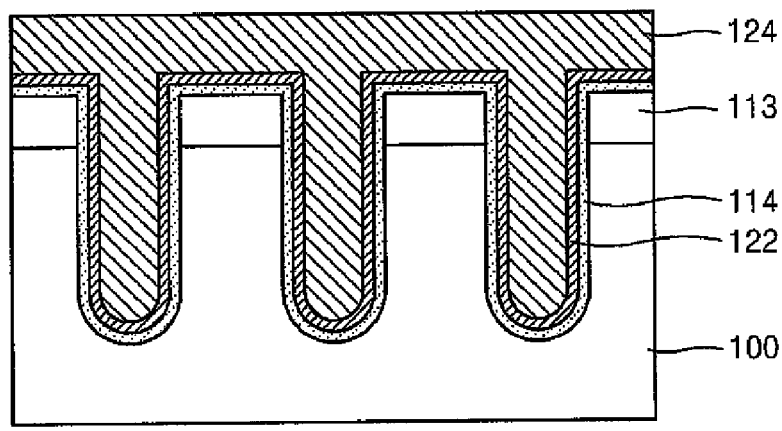

Referring to FIG. 1D, a second gate electrode layer 124 is formed on the first gate electrode layer 122 to fill the trench 105. The second gate electrode layer 124 may be a poly-Si layer doped with impurities to minimize resistance. In this case, a portion of the second gate electrode layer 124 may be used to form a metal silicide layer. Also, the second gate electrode layer 124 may be formed using a CVD process or an ALD process.

Figure 1E:
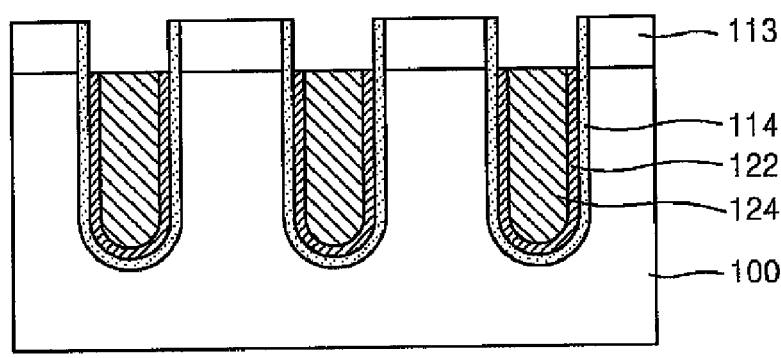

Referring to FIG. 1E, the second gate electrode layer 124 is etched by performing a chemical mechanical polishing (CMP) process and/or an etch back process, until a top surface of the second gate electrode layer 124 become coplanar with the upper surface of the semiconductor substrate 100 (within the trench 105). However, the etching of the second gate electrode layer 124 can be controlled such that the top surface of the second gate electrode layer 124 remains at a level above the upper surface of the semiconductor substrate 100 or is disposed at a level beneath the upper surface of the semiconductor substrate 100 if required. In any case, the etching of the second gate electrode layer 124 may also remove the first gate electrode layer 122 and the gate oxide layer 114 from the top surface of the mask layer pattern 113. Also, the first gate electrode layer 122 may be etched down to the upper surface of the semiconductor substrate 100, as shown in FIG. 1E. Alternatively, the first gate electrode layer 122 may be left on the sidewalls of the mask pattern 113 during this process.

Figure 1F:
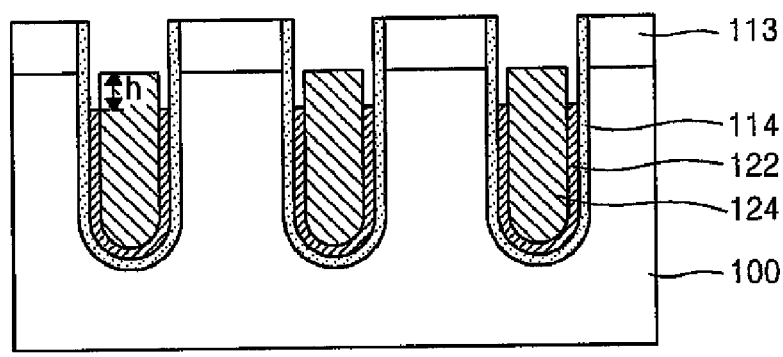

Referring to FIG. 1F, a portion of the first gate electrode layer 122 may be removed from the sides of the trench 105 using, for example, a wet etching process. More specifically, part of the first gate electrode layer 122 may be etched away by oxidizing the SiGe using an etchant containing an oxidizer having different oxidation characteristics with respect to SiGe and silicon. Thus, the second gate electrode layer 124 will not be removed during the selective removal of the first gate electrode layer 122 formed of SiGe. As a result, a lateral surface of the second gate electrode layer 124 is exposed to a depth "h".

Figure 1G:
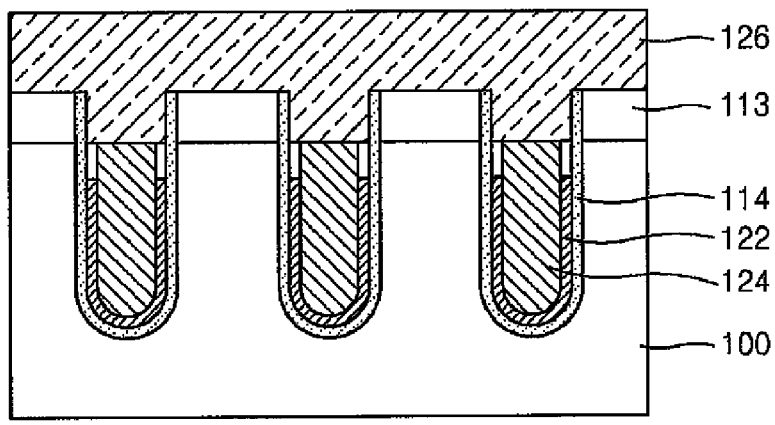

Referring to FIG. 1G, a metal layer 126 is formed on the semiconductor substrate 100 on the second gate electrode layer 124. The metal layer 126 is formed of a refractory metal such as titanium (Ti), cobalt (Co), nickel (Ni), nickel-tantalum (NiTa), nickel-platinum (NiPt), vanadium (V), erbium (Er), zirconium (Zr), hafnium (Hf), molybdenum (Mo), or ytterbium (Yb). The metal layer 126 may be formed using a physical vapor deposition (PVD) process or a CVD process. Furthermore, the metal layer 126 may be formed to such a thickness as to fill the trench 105. In any case, the recess between the gate oxide layer 114 and the second gate electrode layer 124 is not be filled with the metal layer 126 because the recess is very narrow.

Figure 1H:
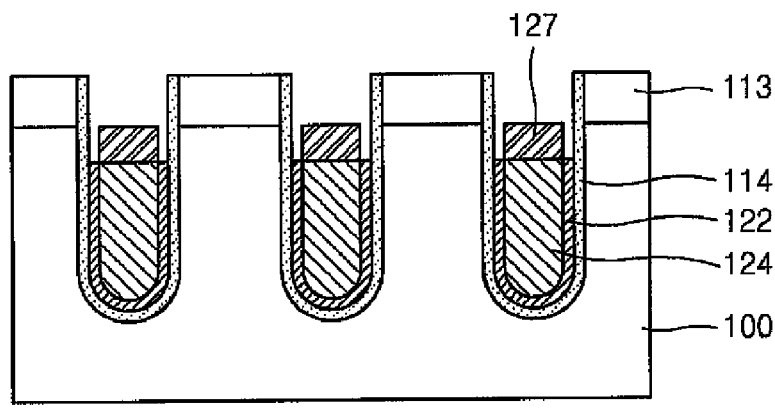

Referring to FIG. 1H, an annealing process is performed such that the metal layer 126 reacts with the second gate electrode layer 124 to form a metal silicide layer 127 on the second gate electrode layer 124. Subsequently, the remainder of the metal layer 126 which has not reacted with the second gate electrode layer 124 is removed. Based on the examples of the material of the metal layer 126 given above, the metal silicide layer 127 may be formed of $TiSi_2$, $CoSi_2$, $NiSi$, $NiTaSi$, $NiPtSi$, $VSi_2$, $ErSi$, $ZrSi_2$, $HfSi$, $MoSi_2$, $CrSi$, or $YbSi$.

When a completely confined poly-Si layer is silicidated by another material including a metal, a void readily forms in the resulting metal silicide. However, in the present embodiment, the lateral surface of the second gate electrode layer 124 formed of poly-Si is exposed by the recessing of the first gate electrode layer 122. Thus, the metal silicide reaction occurs in open environs such that a void is not formed in the metal silicide layer 127.

Figure 1I:
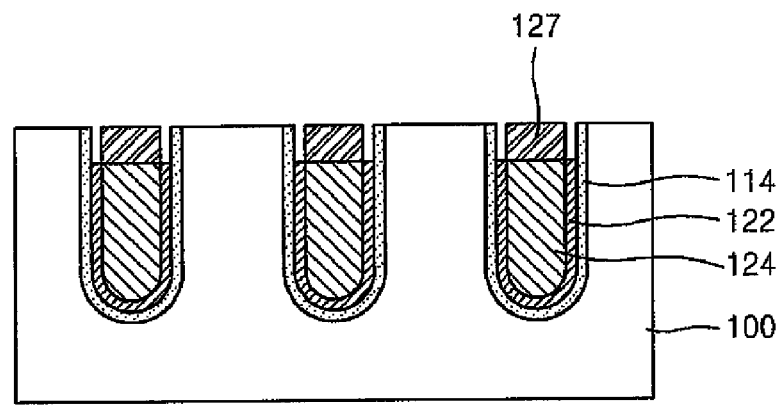

Referring to FIG. 1I, the mask pattern 113 is removed after the metal silicide layer 127 is formed. When the mask pattern 113 is formed using a silicon nitride layer, the mask pattern 113 can be removed by a wet etching process using a nitric acid solution.

FIGS. 2A through 2L illustrate an embodiment, according to the inventive concept, of a method of forming gate electrodes including a buried gate electrode and a stacked gate electrode. In the present example embodiment, the buried gate electrode is formed in a cell region, and the stacked gate is formed in a peripheral circuit region. In this example, the buried gate electrode may constitute a buried word line.

Figure 2A:
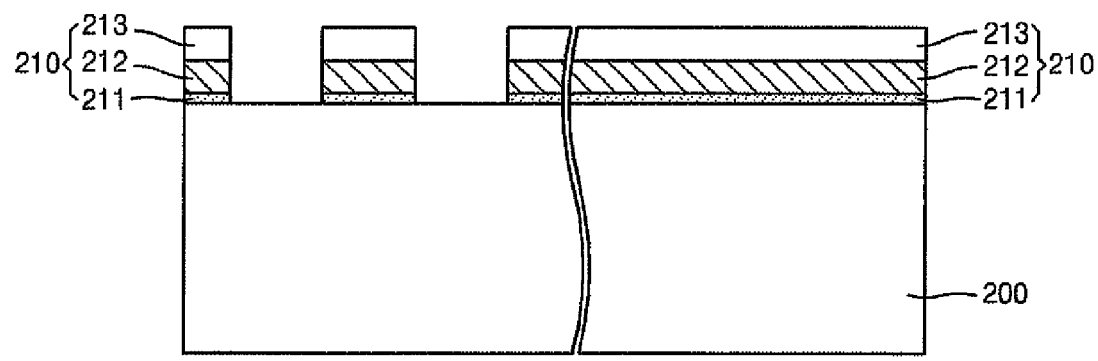
FIGS. 2A through 2L are cross-sectional views of a substrate and together illustrate an embodiment, according to the present inventive concept, of a method of forming gate electrodes including a buried gate electrode and a stacked gate electrode.

Referring to FIG. 2A, a first conformal gate oxide layer 211, a first conductive layer 212, and a first mask layer 213 are sequentially formed on a semiconductor substrate 200. The first gate oxide layer 211 may be a silicon oxide layer or a high-k dielectric layer. In the case in which the gate oxide layer 211 is of silicon oxide, the gate oxide layer 211 may be formed by a thermal oxidation process, a CVD process, or an ALD process. On the other hand, in the case in which the gate oxide layer 211 is of a high-k dielectric, the gate oxide layer 211 may be formed of $HfO_2$, $HfSiO_4$, $HfAlO$, $ZrO_2$, $ZrSiO_4$, $TaO_2$, $Al_2O_3$, BST, or PZT, using a CVD or ALD process. Furthermore, impurities (not shown) may be implanted into regions of the semiconductor substrate 200 before the first gate oxide layer 211 is formed so as to serve as source and drain regions of a transistor (in a cell region).

The first conductive layer 212 is, for example, a doped poly-Si layer. In this case, the first conductive layer 212 can be formed by a CVD process.

The first mask layer 213 is formed of a material having an etch selectivity with respect to the first conductive layer 212 and the semiconductor substrate 200. The first mask layer 213 comprises, for example, a silicon oxide layer or a silicon nitride layer.

Subsequently, the first mask layer 213, the first conductive layer 212, and the first gate oxide layer 211 are patterned using photolithography and etching processes, thereby forming a stack pattern 210 including the patterned first mask layer 213, first conductive layer 212, and first gate oxide layer 211. The stack pattern 210 has an opening in a cell region but not in a peripheral circuit region.

Figure 2B:
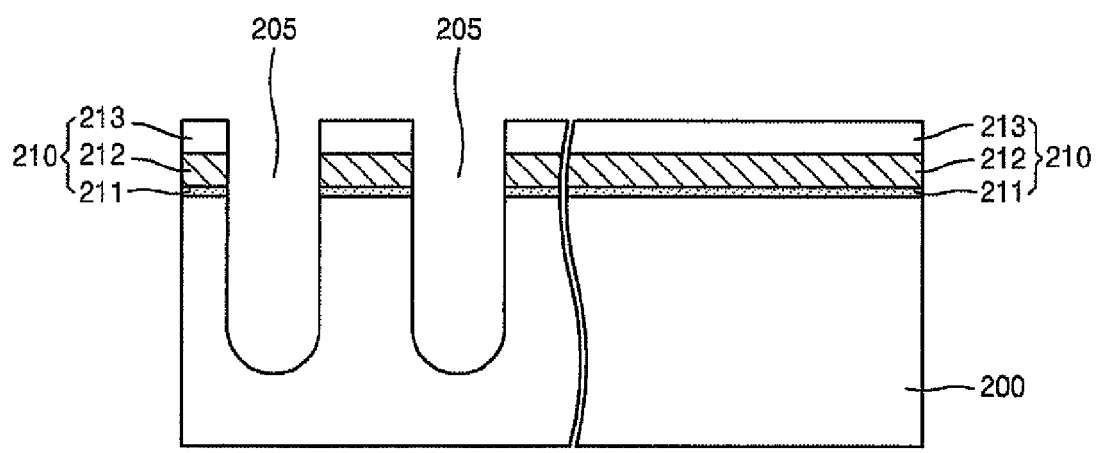

Referring to FIG. 2B, the semiconductor substrate 200 is etched using the stack pattern 210 as a mask, thereby forming a trench 205 in the semiconductor substrate 200 in the cell region. In this case, no trench is formed in the semiconductor substrate 200 in the peripheral circuit region because that part of the substrate 200 corresponding to the peripheral circuit region is covered by the stacked pattern 210.

Figure 2C:
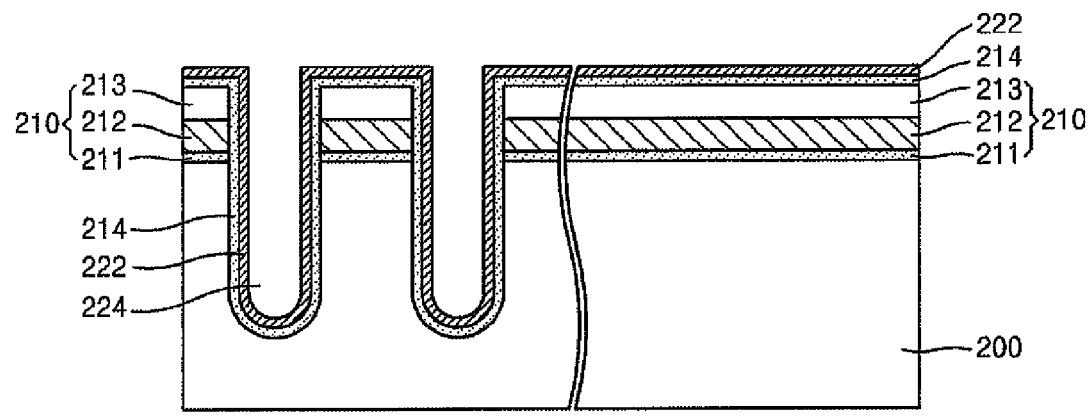

Referring to FIG. 2C, a second conformal gate oxide layer 214 is formed on the semiconductor substrate 200. Thus, the second conformal gate oxide layer 214 extends along the bottom and sides of the trench 205 in the cell region. The second gate oxide layer 214 may be a silicon oxide layer or a high-k dielectric layer. In the case in which the second oxide layer 214 is a silicon oxide layer, the second oxide layer 214 may be formed using a thermal oxidation process, a CVD process, or an ALD process. On the other hand, in the case in which the second oxide layer 214 is a high-k dielectric layer, the second oxide layer 214 is formed of, for example, $HfO_2$, $HfSiO_4$, $HfAlO$, $ZrO_2$, $ZrSiO_4$, $TaO_2$, $Al_2O_3$, BST, or PZT, by a CVD or ALD process.

Subsequently, a first gate electrode layer 222 is formed on the second gate oxide layer 214. In this embodiment, the first gate electrode layer 222 is in direct contact with the second gate oxide layer 214 and contributes to establishing the threshold voltage of the gate. The first gate electrode layer 222 may be formed of SiGe. More specifically, the first gate electrode layer 222 may be a poly-SiGe layer doped with impurities so as to have a desired work function and a relatively high conductivity. In this case, the first gate electrode layer 222 may be formed using a CVD process or an ALD process.

As described previously with respect the embodiment of FIGS. 2A-2I, depletion, which occurs in a poly-Si layer near the interface between the poly-Si layer and a gate oxide layer, is suppressed in a SiGe layer near the interface between a SiGe layer and the gate oxide layer. Also, this arrangement may be characterized as having a relatively small equivalent oxide thickness (EOT). Furthermore, a high-k dielectric layer formed of SiGe is more thermodynamically stable than a poly-Si layer. Also, the SiGe layer has a lower resistance than a poly-Si layer. Therefore, the SiGe layer helps to minimize the resistance of the gate electrode. Finally, forming the SiGe layer does not produce by-products (e.g., Cl) that degrade the gate oxide layer. Therefore, a highly reliable of a transistor may be produced.

Figure 2D:
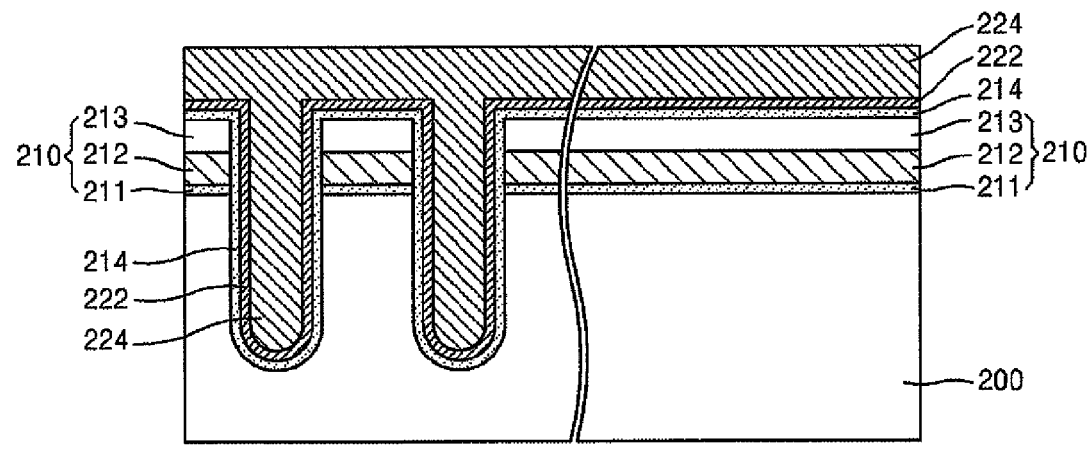

Referring to FIG. 2D, a second gate electrode layer 224 is formed on the first gate electrode layer 222 to fill the trench 205. The second gate electrode layer 224 may be a poly-Si layer doped with impurities so as to have a relatively low resistance. The second gate electrode layer 224 can be formed using a CVD process.

Figure 2E:
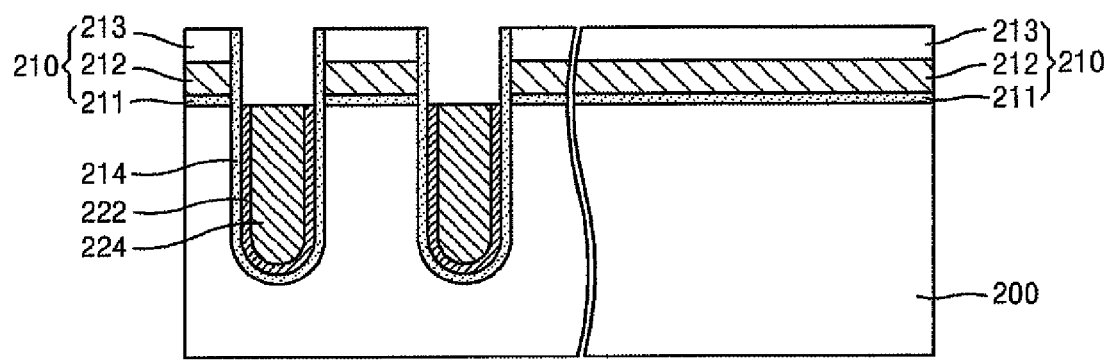

Referring to FIG. 2E, the second gate electrode layer 224 is etched using a CMP process and/or an etch back process until an upper surface of the second gate electrode layer 224 becomes coplanar with the upper surface of the semiconductor substrate 200 (within the trench 205). However, the etching of the second gate electrode layer 224 can be controlled such that the top surface of the second gate electrode layer 224 remains at a level above the upper surface of the semiconductor substrate 200 or is disposed at a level beneath the upper surface of the semiconductor substrate 200 if required. In any case, the etching of the second gate electrode layer 224 may also remove the first gate electrode layer 222 and the gate oxide layer 214 from the top surface of the stacked pattern 210. Also, the first gate electrode layer 222 may be etched down to the upper surface of the semiconductor substrate 200, as shown in FIG. 2E. Alternatively, the first gate electrode layer 222 may be left on the sidewalls of the stacked pattern 210 during this process.

Figure 2F:
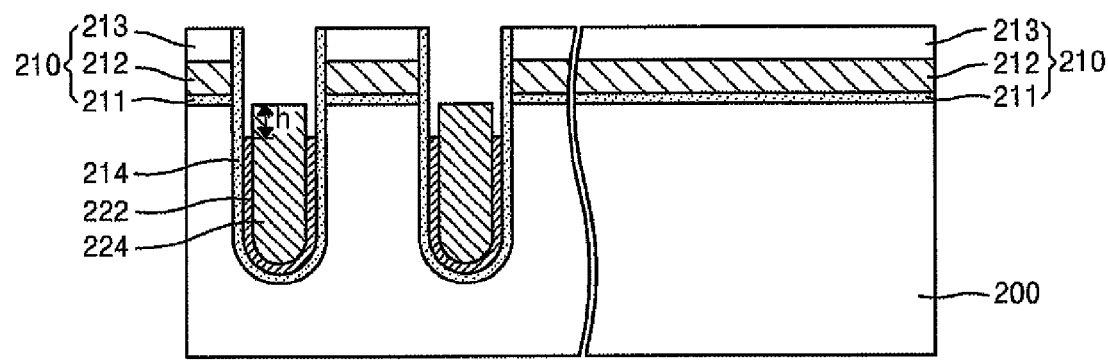

Referring to FIG. 2F, a portion of the first gate electrode layer 222 may be removed from the sides of the trench 205 in the cell region by, for example, a wet etching process. Similar to the process described above with respect to FIG. 1F, part of the first gate electrode layer 222 may be etched away by oxidizing the SiGe using an etchant containing an oxidizer having different oxidation characteristics with respect to SiGe and silicon. Thus, the second gate electrode layer 224 will not be removed during the selective removal of the first gate electrode layer 222 formed of SiGe. As a result, a lateral surface of the second gate electrode layer 224 is exposed to a depth "h". The depth "h" corresponds to a difference in height or simply the distance between the top surface of the second gate electrode layer 224 and the upper face (edge) of the first gate electrode layer 222. A desired depth "h" may be obtained by controlling the parameters of the wet etch process to remove a predetermined amount of the first gate electrode layer 222.

Figure 2G:
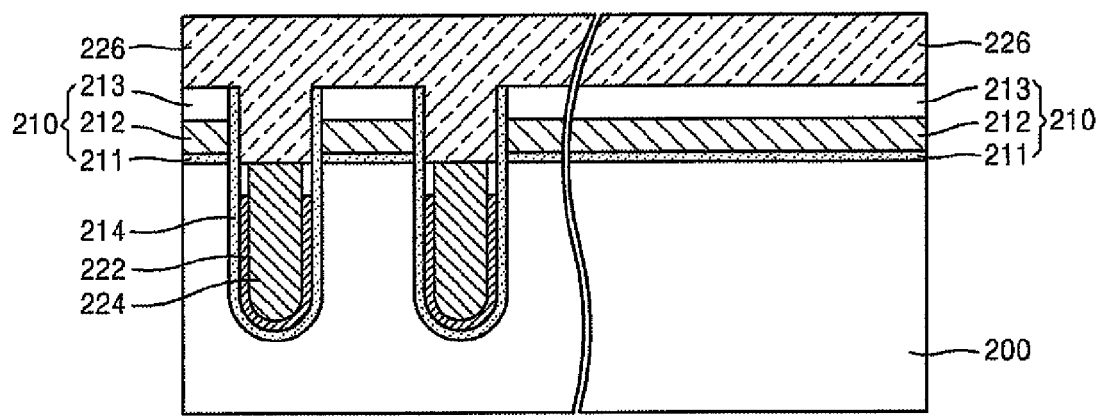

Referring to FIG. 2G, next, a metal layer 226 is formed on the second gate electrode layer 224 on the semiconductor substrate 200. The metal layer 226 may be formed to such a thickness as to fill the trench 205.

The metal layer 226 is formed of a refractory metal such as Ti, Co, Ni, NiTa, NiPt, V, Er, Zr, Hf, Mo, or Yb. The metal layer 226 may be formed using a PVD process or a CVD process. In any case, the recess formed by removing a portion of the first gate electrode layer 222 from the sides of the trench 205 is not be filled with the metal layer 226 because the recess is very narrow.

Figure 2H:
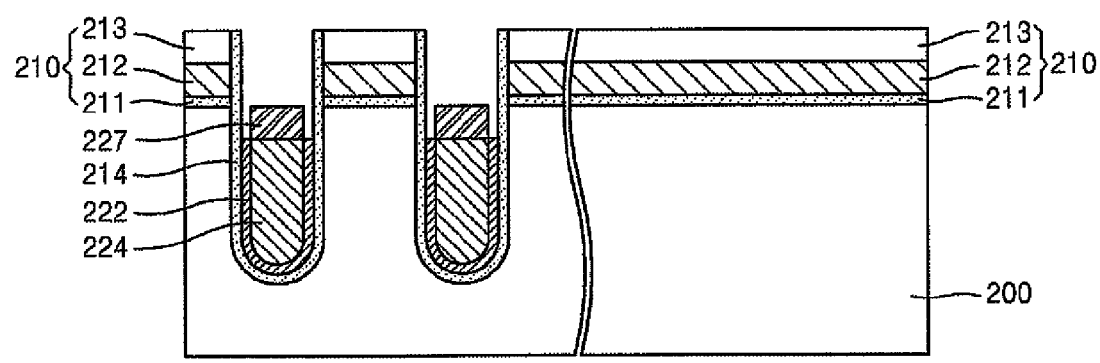

Referring to FIG. 2H, an annealing process is performed such that the metal layer 226 reacts with the second gate electrode layer 224 to form a metal silicide layer 227. Subsequently, the remainder of the metal layer 226 that did not react with the second gate electrode layer 224 is removed. Based on the examples of those materials specified above for the second gate layer 224 and the metal layer 226, the metal silicide layer 227 may be a layer of $TiSi_2$, $CoSi_2$, NiSi, NiTaSi, NiPtSi, $VSi_2$, ErSi, $ZrSi_2$, HfSi, $MoSi_2$, CrSi, or YbSi.

Also, as was explained above in connection with the embodiment of FIGS. 1A-1I, when a completely confined poly-Si layer is silicidated by another material including a metal, a void readily forms in the resulting metal silicide. However, in the present embodiment, the lateral surface of the second gate electrode layer 224 formed of poly-Si is exposed by the recessing of the first gate electrode layer 222. Thus, the metal silicide reaction occurs in open environs such that a void is not formed in the metal silicide layer 227.

Figure 2I:
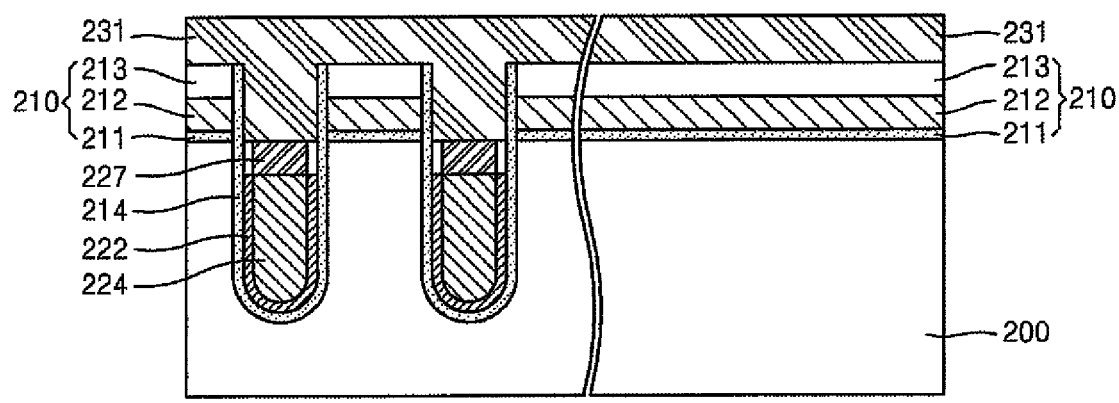

Referring to FIG. 2I, a second mask layer 231 is formed on the semiconductor substrate 200. The second mask layer 231 is of material having an etch selectivity with respect to the first conductive layer 212. The second mask layer 231 may be a silicon oxide layer or a silicon nitride layer.

Figure 2J:
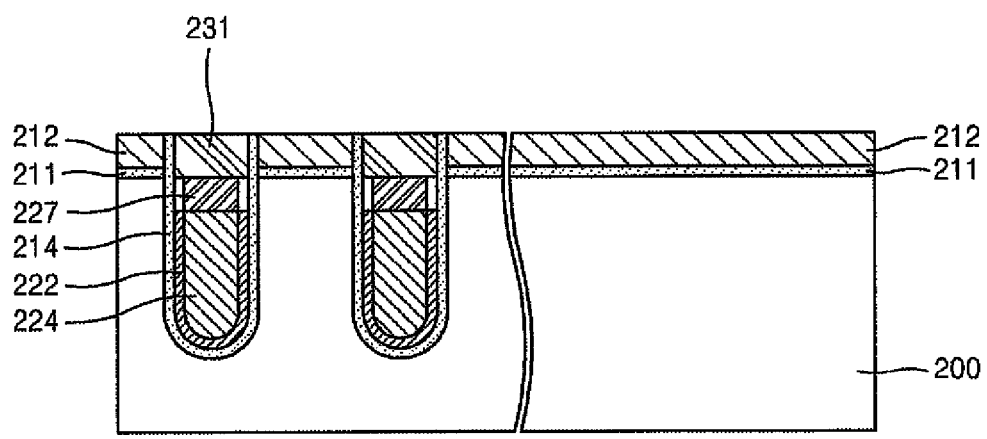

Referring to FIG. 2J, an etchback process or a CMP process is then performed using the first conductive layer 212 as an etch stop layer, thereby leaving part of the second mask layer 231 within the trench 205 in the cell region. As another result, an upper surface of the first conductive layer 212 is exposed in the cell region and in the peripheral circuit region.

Figure 2K:
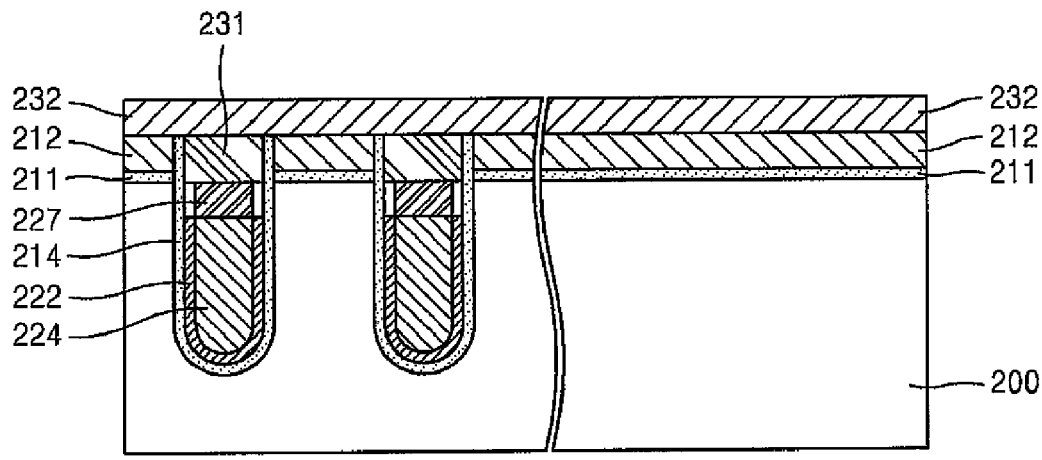

Referring to FIG. 2K, a second conductive layer 232 is formed on the first conductive layer 212. The second conductive layer 232 may be a layer of W or WSi, or a silicide of a refractory metal from selected from the group mentioned above in connection with the first metal layer 226.

Figure 2L:
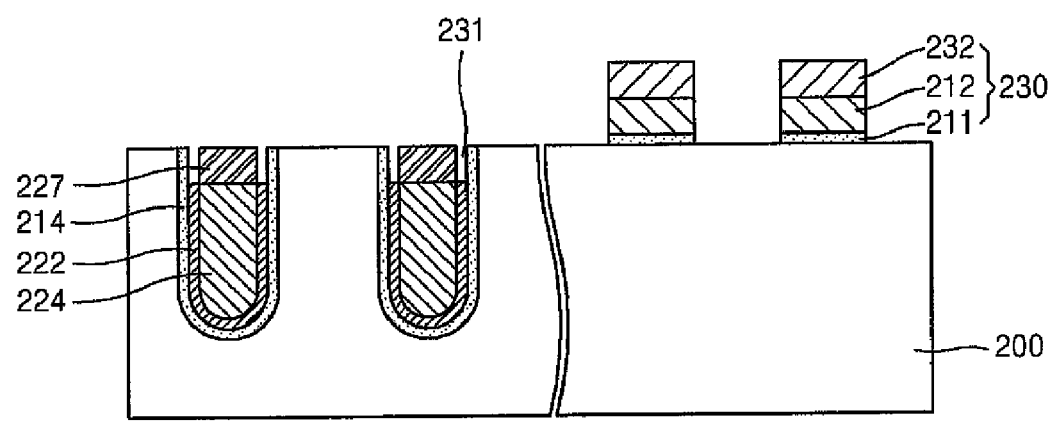

Referring to FIG. 2L, the first and second conductive layers 212 and 232 are patterned, thereby forming a stacked gate electrode 230 in the peripheral circuit region. Note, however, although the present embodiment forms the gate electrode 230 in the peripheral circuit region as a stacked structure (having two layers), the gate electrode 230 may be alternatively formed as a single layer in the peripheral circuit region.

Furthermore, impurity regions (not shown) functioning as source and drain regions may be formed on both sides of the stacked gate electrode 230 in the peripheral circuit region.

According to the inventive concept described above, there is provided a method of forming a buried gate electrode by which a reliable gate oxide layer and a word line having a relatively low resistance are produced. According to embodiments of the inventive concept, a buried gate electrode is formed of a SiGe layer and a metal silicide layer, and the metal silicide layer is formed in on an Si layer having exposed lateral surfaces, i.e., in open environs. As a result, the gate oxide layer is not degraded, the EOT is characteristically small, the resistances of the gate electrode and word line are minimal, and the resistance in the structure may uniform.

Finally, embodiments of the inventive concept have been described herein in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A method of forming a buried gate electrode, comprising:
    forming a trench in a substrate;
    subsequently forming a gate oxide layer on the substrate conforming to the topography of the substrate such that the gate oxide layer extends along surfaces that define the trench;
    forming a first gate electrode layer conformally on the gate oxide layer in the trench;
    forming a silicon layer on the first gate electrode layer and in the trench;
    removing a portion of the first gate electrode layer to form a recess in which a portion of a lateral surface of the silicon layer is exposed within the trench;
    forming a metal layer on the silicon layer; and
    subsequently annealing the substrate while the recess exposes the lateral surface of the silicon layer to form a metal silicide layer on the silicon layer.

2. The method of claim 1, wherein the forming of the first gate electrode layer comprises forming a layer of silicon germanium (SiGe) on the gate oxide layer.

3. The method of claim 1, wherein the forming of the first gate electrode layer comprises forming an electrode layer doped with impurities on the gate oxide layer.

4. The method of claim 1, wherein the forming of the silicon layer comprises forming a polycrystalline silicon (poly-Si) layer doped with impurities on the first gate electrode layer.

5. The method of claim 1, wherein the forming of the gate oxide layer comprises forming a silicon oxide layer or a high-k dielectric layer on the substrate.

6. The method of claim 1, wherein the forming of the trench comprises:
    forming a mask pattern on a semiconductor substrate; and
    etching the semiconductor substrate using the mask pattern as an etch mask.

7. The method of claim 6, wherein the forming of the silicon layer to fill the trench comprises:
    forming a silicon layer on the semiconductor substrate; and
    planarizing the silicon layer until an upper surface of the silicon layer becomes coplanar with the upper surface of the semiconductor substrate.

8. The method of claim 1, wherein the recessing of the first gate electrode layer is comprises wet etching the first gate electrode layer with an etchant having an etch selectivity with respect to the silicon layer.

9. The method of claim 1, wherein the metal layer is formed of one material selected from the group consisting of titanium (Ti), cobalt (Co), nickel (Ni), nickel-tantalum (NiTa), nickel-platinum (NiPt), vanadium (V), erbium (Er), zirconium (Zr), hafnium (Hf), molybdenum (Mo), and ytterbium (Yb).

10. The method of claim 1, further comprising forming source and drain regions in the substrate before the trench is formed.

11. A method for use in forming gate electrodes of a semiconductor device, comprising:

forming a first gate oxide layer on a semiconductor substrate including in a cell region and a peripheral circuit region;

forming a stacked pattern on the first gate oxide layer, the stacked pattern including a first conductive layer and a first mask layer disposed on the first conductive layer, and the stacked pattern having an opening therethrough in the cell region;

etching the semiconductor substrate using the stacked pattern as an etch mask to form a trench in the semiconductor substrate in the cell region;

forming a second gate oxide layer on the semiconductor substrate conforming to the topography of the substrate such that the gate oxide layer extends along surfaces that define the trench;

forming a first buried gate electrode layer conformally on the second gate oxide layer in the trench;

forming a silicon layer on the first buried gate electrode layer and in the trench;

removing a portion of the first buried gate electrode layer from an upper part of the trench to form a recess in which a portion of a lateral surface of the silicon layer is exposed;

forming a metal layer on the silicon layer;

subsequently annealing the semiconductor substrate while the recess exposes the lateral surface of the silicon layer to react part of the metal layer with the silicon layer and thereby form a metal silicide layer over the silicon layer; and removing a remainder of the metal layer that did not react with the silicon layer in the forming of the metal silicide layer.

12. The method of claim 11, wherein the forming of the first buried gate electrode layer comprises forming a layer of silicon germanium (SiGe) on the second gate oxide layer in the trench.

13. The method of claim 11, further comprising:

forming a second mask layer on the metal silicide layer in the trench; and forming a gate electrode in the peripheral circuit region including by patterning the first conductive layer after the second mask has been formed.

14. The method of claim 13, further comprising forming a second conductive layer on the first conductive layer and on the second mask layer, and wherein the forming of the gate electrode in the peripheral circuit region comprises forming a stacked gate electrode in the peripheral circuit region by patterning the first and second conductive layers.

15. The method of claim 11, wherein the forming of the stacked pattern comprises forming a doped poly-Si layer as the first conductive layer.

16. The method of claim 14, wherein the forming of the second conductive layer comprises forming a layer of material selected from the group consisting of tungsten (W), tungsten silicide (WSi), and a silicide of a refractory metal on the first conductive layer and on the second mask layer.

17. The method of claim 16, wherein the second mask layer is formed of the same material as the first mask layer.

* * * * *